United States Patent [19]

Jackson et al.

[11] Patent Number: 4,654,226
[45] Date of Patent: Mar. 31, 1987

[54] APPARATUS AND METHOD FOR PHOTOCHEMICAL VAPOR DEPOSITION

[75] Inventors: Scott C. Jackson; Richard E. Rocheleau, both of Wilmington, Del.

[73] Assignee: The University of Delaware, Newark, Del.

[21] Appl. No.: 835,331

[22] Filed: Mar. 3, 1986

[51] Int. Cl.$^4$ .............................................. B05D 3/06
[52] U.S. Cl. .................................. 427/54.1; 118/50.1; 118/719; 118/620; 118/641
[58] Field of Search ......................... 427/53.1, 54.1; 118/715, 719, 50.1, 620, 641, 642

[56] References Cited

U.S. PATENT DOCUMENTS

| | | |
|---|---|---|
| 4,265,932 | 5/1981 | Peters et al. |
| 4,348,428 | 9/1982 | Rockley et al. |
| 4,371,587 | 2/1983 | Peters . |
| 4,435,445 | 3/1984 | Allred et al. |
| 4,447,469 | 5/1984 | Peters . |
| 4,454,835 | 6/1984 | Walsh et al. |
| 4,525,381 | 6/1985 | Tanaka et al. |
| 4,525,382 | 6/1985 | Sugioka . |
| 4,543,271 | 9/1985 | Peters . |
| 4,597,986 | 7/1986 | Scapple et al. ................. 427/54.1 |

OTHER PUBLICATIONS

"Photochemical Vapor Deposition of Undoped and n-Type Amorphous Silicon Films Produced from Disilane", Takeshi Inoue et al., Aug. 2, 1983, Japan.
"Amorphous Silicon-Germanium Deposited by Photo-CVD", H. Itozaki et al., presented to Materials Research Society on Apr. 15-18, 1985, Japan.
"Valency Control in Photochemically-Deposited a--Si:H from $Si_2H_6$", T. Kazahaya et al., Japan.
"High Performance a-Si Solar Cells and Narrow Bandgap Materials", Shoichi Nakano et al., 1985 Spring Meeting, Japan.
"Solid State Devices", Japanese Journal of Applied Physics, vol. 22(1983) Supplement 22-1, Tadashi Saitoh et al., 1982.
"Optical and Electrical Properties of Amorphous Silicon Films Prepared by Photochemica Vapor Deposition", T. Saitoh et al., Jan. 24, 1983, Japan.
"Amorphous Silicon Solar Cells Fabricated by Photochemical Vapor Deposition", Tatsuya Tanaka et al., Jul. 27, 1984, Japan.
"Photo CVD System for Silicon Nitride Film", Y. Numasawa et al., Apr. 11, 1985, Japan.
"Mechanisms of Metallo-Organic Vapor Phase Epitaxy and Routes to a Ultraviolet Process", J. Haigh, Apr. 18, 1985.
"Photo-Excited Molecular Layer Epitaxy for Better Control of Impurities", Dr. Jun-Ichi Nishizawa, Oct. 1984.
"Photo-Metal Organic Vapor Phase Epitaxy: A Low Temperature Method for the Growth of $Cd_xHg_{1-x}Te$", S. J. C. Irvine et al., Apr. 23, 1985.
Epitaxial Growth of $Cd_xHg_{1-x}Te$ by Photo-MOVPE, S. J. C. Irvine et al., Mar. 8, 1985.
"Photolysis-Assisted OMVPE Growth of CdTe", D. W. Kisker and R. D. Feldman, *Materials Letters*, vol. 3, No. 12, Sep. 1985.
"Photon Assisted OMVPE Growth of CdTe", D. W. Kisker and R. D. Feldman, Nov. 1985.
"Photochemical Deposition of Sn for Use in Molecular Beam Epitaxy of GaAs", Steven P. Kawalszyk and D. L. Miller, May 28, 1985.

*Primary Examiner*—John H. Newsome

[57] ABSTRACT

A photochemical vapor deposition apparatus includes a reactor housing having a window in one wall above a reaction chamber in the housing. A transparent curtain divides the reaction chamber into a reaction zone and a flush zone. At least one substrate is mounted in the reaction zone in light communication with the window so that ultraviolet radiation may penetrate through the window into the reaction zone. The window is kept clear by a gas flowing through the flush zone.

22 Claims, 12 Drawing Figures

APPARATUS AND METHOD FOR PHOTOCHEMICAL VAPOR DEPOSITION

GOVERNMENT RIGHTS

The government has rights in this invention pursuant to Subcontract No. XB-4-04061 awarded by the Solar Energy Research Institute.

BACKGROUND OF THE INVENTION

This invention relates generally to an apparatus and method for photochemical vapor deposition of materials on substrates and particularly to photochemical vapor deposition of semiconductor thin films.

Photochemical vapor deposition is useful for depositing thin films of conductors, insulators and semiconductors. U.S. Pat. No. 4,371,587 issued Feb. 1, 1983 to J. W. Peters describes photochemical deposition of silicon dioxide passivation layers for semiconductor devices. U.S. Pat. No. 4,265,932 issued May 5, 1981 to J. W. Peters and F. L. Gebhard describes photochemical vapor deposition of silicon nitride passivation layers for semiconductor devices. T. Inoue et al in "Photochemical Vapor Deposition of Undoped and n-Type Amorphous Silicon Films Produced from Disilane", *Applied Physics Letters Volume* 43, No. 3, Oct. 15, 1983, pp. 774–776, describe photochemical vapor deposition of hydrogenated amorphous silicon films for photovoltaic solar cells and thin film semiconductor devices.

The photochemical vapor deposition process is initiated by transmission of radiation through a window which forms the top of the deposition chamber. During the deposition, the window is subject to becoming coated with deposited material. This coating diminishes the transparency of the window, which diminishes the amount of radiation which enters the deposition camber to initiate the photochemical reaction, and thus impedes the rate of deposition and the ultimate thickness of deposition that may be achieved.

Several solutions to the problem of deposition on the window have been proposed. In the aforementioned publication by Inoue et al, coating of the window with a low vapor pressure oil in order to prevent the window from clouding due to deposition of amorphous silicon film on it was described.

T. Kazahaya et al in "Valency Control in Photochemically-Deposited a-Si:H from $Si_2H_6$"*Technical Digest of the International PVSEC*-1, Kobe, Japan (1984), pp. 449–552 describe blowing a stream of nitrogen gas near the window. A similar approach is described in U.S. Pat. No. 4,435,445 issued Mar. 6, 1984 to D. D. Allred et al.

The aforementioned U.S. Pat. No. 4,265,932 discloses a mobile transparent window apparatus comprising a polyvinylidene fluoride film that is drawn across the internal face of the window within the reaction chamber and means for moving the film across the internal face of the window. The mobile film is placed at the internal face of the reactor window during deposition in order to prevent undesirable deposition of material on the internal face of the reactor window. Movement of the film across the internal face of the reactor window is provided to remove material deposited on the film from the path of incoming radiation and to maintain the window in a clean and transparent state. Guide rolls are provided for optimal spacing, including contact, between the mobile film and window but with minimized friction between the window and film so that reactant gases are kept out of contact with the internal face of the window.

None of these solutions have proven to be entirely satisfactory. Coating the reactor window with oil, as described in the Inoue et al publication, introduces contamination, is not reproducible and is not effective for long periods of time. Providing a stream of non-reactive gas across the face of the reactor window, as described in the Kazahaya et al publication and U.S. Pat. No. 4,435,445, has limited effectiveness due to unavoidable transport of reactive gses to the region of the reactor window. The mobile transparent window of U.S. Pat. No. 4,265,932 requires a mechanically imposed gas-tight seal between the film and reactor window. Leakage of reactive gas into the space between the film and window is difficult to avoid during long periods of operation.

SUMMARY OF THE INVENTION

An object of this invention is to provide a photochemical deposition apparatus wherein selected materials are deposited on a substrate.

A further object of this invention is to provide a photochemical vapor deposition apparatus wherein selected materials are deposited on substrates of large areas and at high deposition rates.

A still further object of this invention is to provide a photochemical vapor deposition apparatus wherein undesirable deposition on the reactor window is eliminated.

A yet further object of this invention is to provide a photochemical vapor deposition apparatus wherein layers of selected material are deposited sequentially on a substrate.

Another object of this invention is to provide a photochemical vapor deposition apparatus wherein selected material is deposited on a substrate that is moved in and out of the apparatus.

Still yet another object of this invention is to provide a photochemical deposition apparatus having more than one deposition zone wherein selected materials are deposited sequentially on movable substrates.

Another object of this invention is to provide a method and apparatus for photochemical deposition of amorphous silicon containing semiconductor thin films.

The photochemical vapor deposition apparatus of this invention includes a reaction chamber with a transparent window in its top wall. The reaction chamber is divided into two zones, sealably separated by a transparent movable curtain or film. Means are provided for introducing a first gas mixture into the flush zone or space between the window and the film. Further means are provided for introducing a second gas mixture into the reaction zone or space between the film and the substrate. The apparatus also includes a means for controlling the temperature of the substrate that is placed in the reaction zone. Means are provided for controlling the pressure and flow of the gas mixtures in the flush zone and in the reaction zone. External means produce radiation and introduce the radiation through the window.

DETAILED DESCRIPTION

Figures 1, 3:
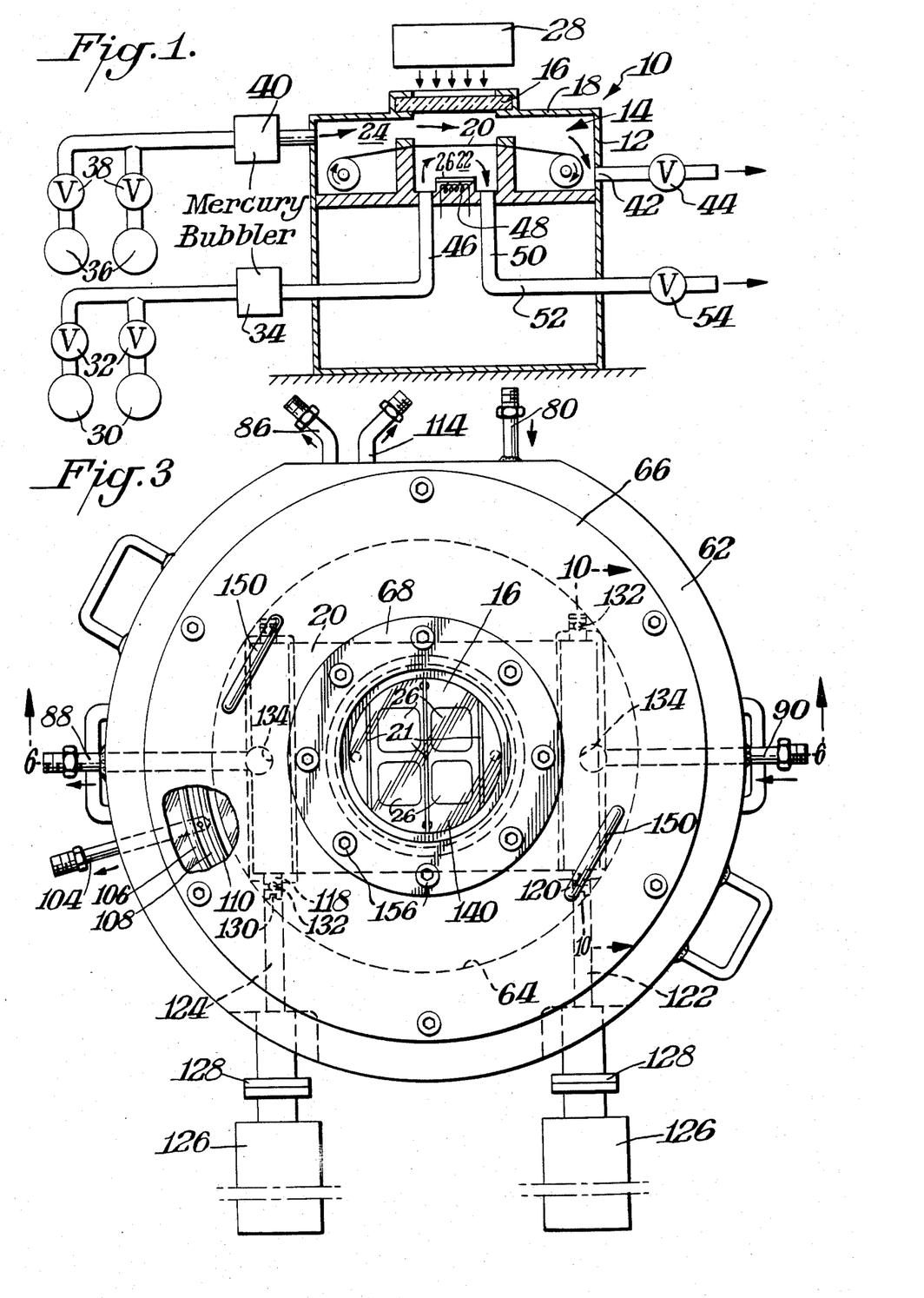
FIG. 1 is a schematic view partly in section illustrating a photochemical vapor deposition apparatus of this invention.
FIG. 3 is a top plan view of an apparatus such as illustrated in FIGS. 1-2 in accordance with this invention.

FIG. 1 schematically illustrates the concepts of this invention. As shown therein, the photochemical vapor deposition apparatus 10 includes a housing 12 having a reaction chamber 14 in the top portion thereof. A transparent window 16 is mounted in the top wall 18 of housing 12.

As illustrated in FIG. 1, a transparent curtain 20 separates reaction chamber 14 into a reaction zone 22 and a flush zone 24. Reaction zone 22 has at least one substrate 26 mounted therein in light communications with window 16. Accordingly an ultraviolet light 28 may be located outside window 16 to illuminate window 16 with the radiation passing therethrough, entering flush zone 24, passing through curtain 20 and entering reaction zone 22.

A reactant gas is fed from one or more reservoirs 30 through suitable valves 32 and mercury bubbler 34 into reaction zone 22 so that the photochemical vapor deposition results on substrate 26 as a result of the UV radiation in reaction zone 22.

In accordance with this invention, an inert diluent and another diluent and/or reaction inhibitor gases are fed from suitable reservoirs 36 through valves 38 and, optionally, mercury bubbler 40 into flush zone 24. Thus inert and inhibitor gases from reservoirs 36 mix or dilute any reactant gases or inhibit deposition from reactant gases that may be in flush zone 24. These gases subsequently reduce or eliminate window fouling several ways. Specifically, diluting the reactant gases results in reducing the reaction rate in the flush zone 24. In addition, the gas phase reactions are modified in flush zone 24 in some manner as to inhibit the formation in gas phase precursors necessary for film growth. Further, the surface reactions on the window 16 are modified so as to stop film formation from the gas phase. The inert and/or inhibitor gases leave flush zone 24 through an exit port 42, through a pressure regulating valve 44 and to a suitable pump and vent stack.

The reactant and inert diluent gases fed from reservoirs 30 are evenly distributed throughout the reaction zone 22 by passing through a suitably designed gas distribution manifold 46. These reactant gases thus form a solid deposit on the substrate 26 by a photochemical vapor deposition process. The light from lamp 28 initiates this process as previously described. The substrate or substrates 26 are suitably heated by a furnace 48 mounted therebeneath. The reactant gases leave reaction zone 22 and pass through a collection manifold 50 into an outlet line 52 through a pressure regulatory valve 54 and to a pump and into a suitable vent.

FIGS. 2-10 illustrate the details for a preferred practice of this invention. These details, in general, involve the structural members in the reaction chamber 14 at the upper end of housing 12.

Figure 2:
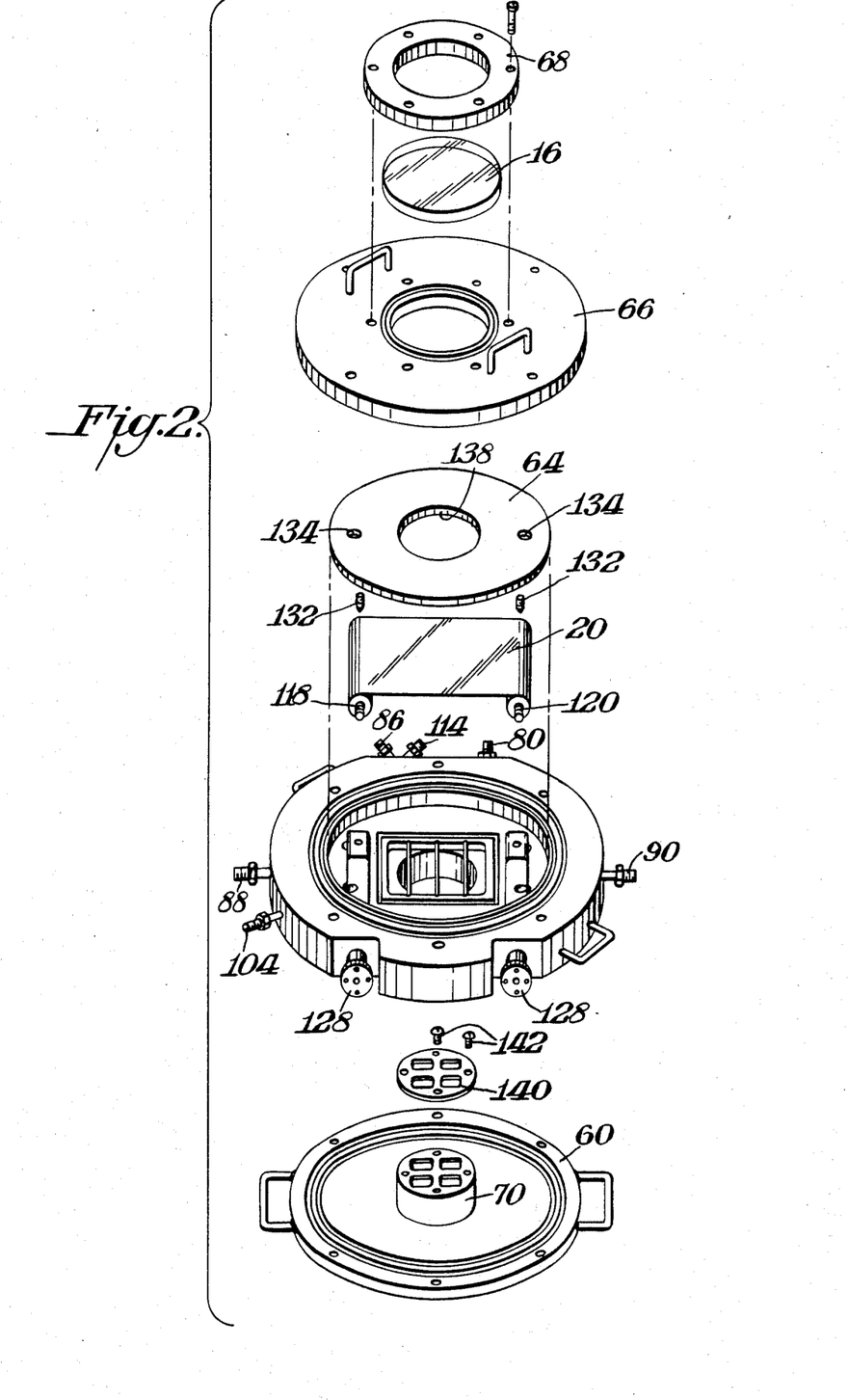
FIG. 2 is an exploded view of the main components used in the apparatus of this invention.
Figure 6:
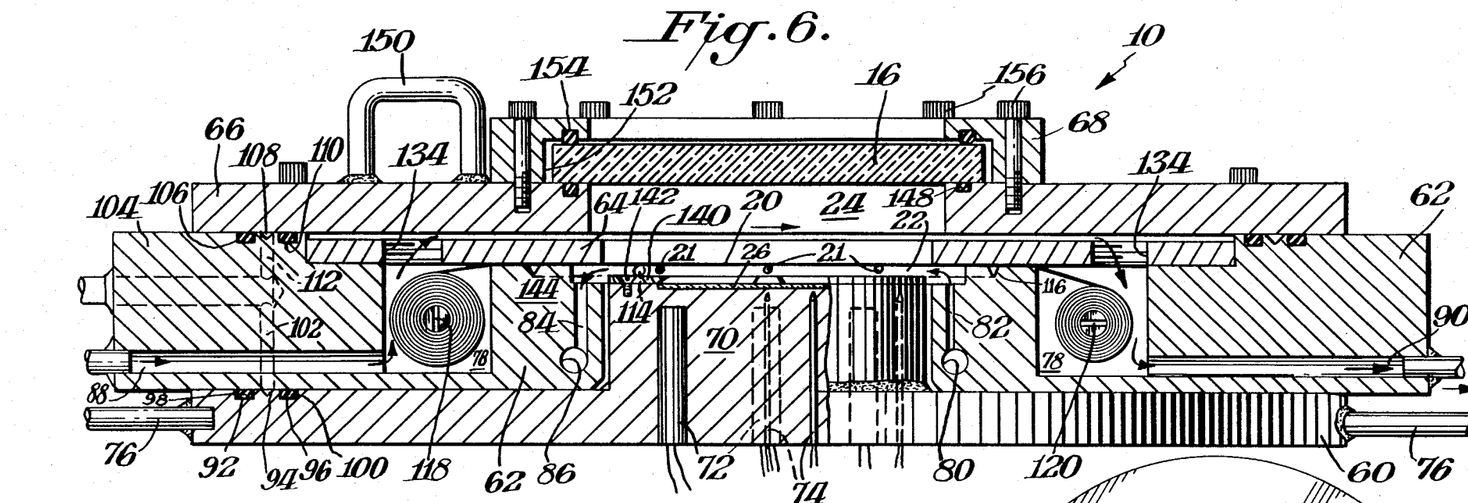
FIG. 6 is a cross-sectional view taken through FIG. 3 along the line 6—6.

As best shown in FIGS. 2 and 6, apparatus 10 includes a substrate base plate 60 above which is mounted a curtain plate 62 having an annular recess into which is fitted a floating clamp plate 64. A window mounting plate 66 is mounted on top of this assembly onto which is mounted a window mounting ring 68 for housing quartz window 16.

Figure 7:
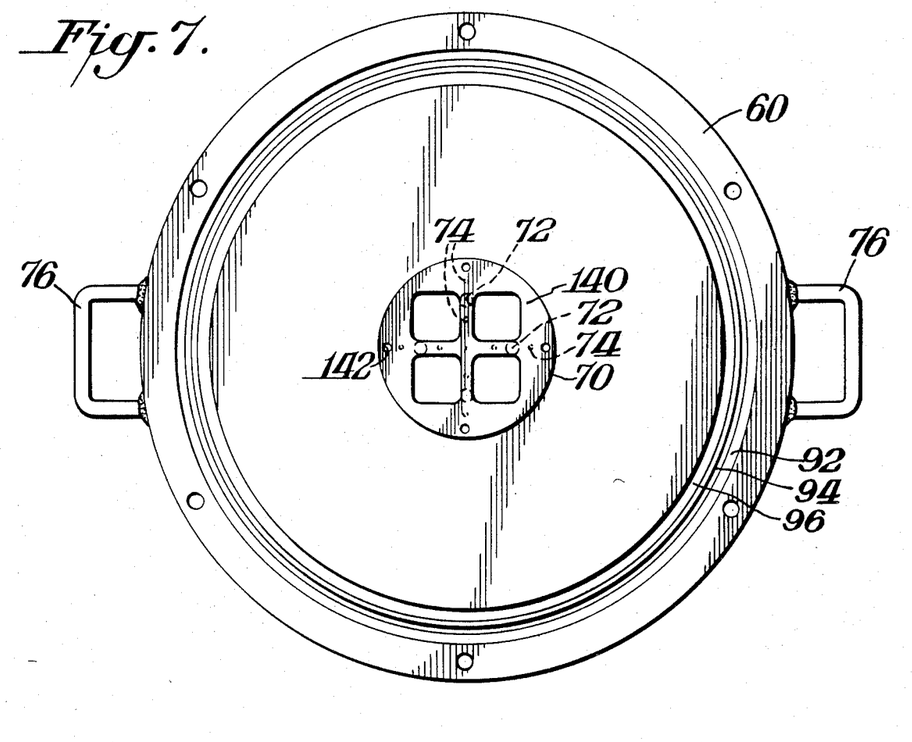
FIG. 7 is a top plan view of the substrate base plate used in the apparatus of FIGS. 2-6.

The details of substrate plate 60 are best shown in FIGS. 2 and 6-7. As indicated therein, plate 60 includes a central boss or platform section 70 having a recess into which the substrates 26 are placed. A plurality of heater elements 72 form the furnace 48 illustrated in FIG. 1. A suitable number of thermocouples 74 are provided in boss 70 to sense the temperature at both the midpoint and outside edges of boss or platform 70. As shown in FIGS. 2 and 6, a pair of handles 76 are secured to base plate 60 for ready manipulation in the assembly and disassembly thereof.

Figure 8:
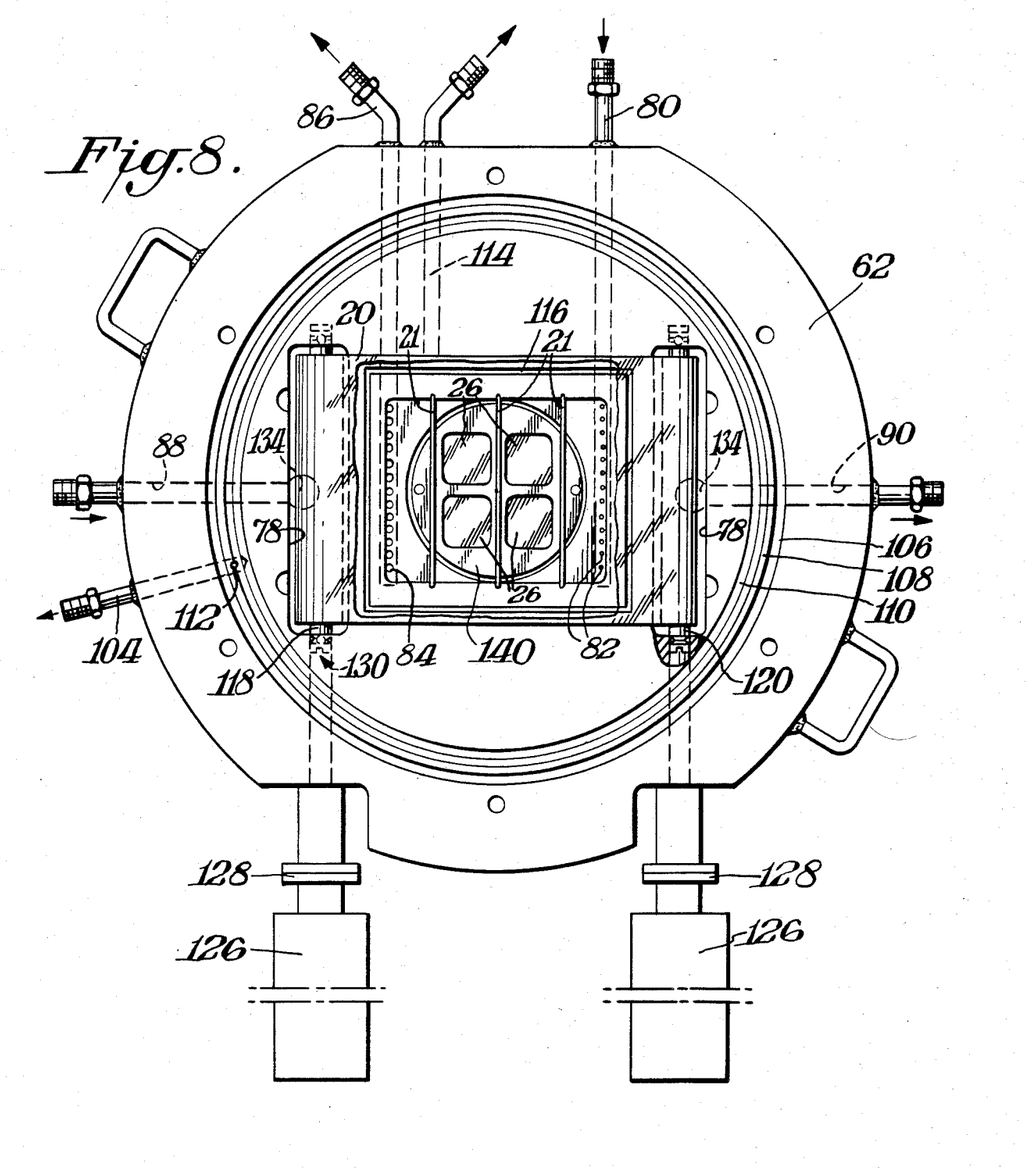
FIG. 8 is a top plan view of the curtain plate used in the apparatus of FIGS. 2-6.

FIGS. 2, 6 and 8 illustrate the details of curtain plate 62. As shown therein, a pair of elongated pockets 78 are formed in the exposed top face of plate 62. Sets of passageways are also formed in plate 62. These passageways include horizontal inlet reactant gas passageway 80 which leads to a series of vertical passageways 82 (FIG. 6) which in turn terminates at the top face of curtain plate 62 generally adjacent to platform 70. Similarly, a series of vertical passageways 84 extends from the upper face of plate 62 leading to horizontal outlet passageway 86. These inlet and outlet passageways correspond to the reactant gas flow lines 46 and 50 of FIG. 1.

Curtain plate 62 also includes an inlet flush gas passageway 88 and an outlet flush gas passageway 90, each communicating with a respective pocket 78.

As illustrated in FIG. 6, the top surface of substrate plate 60 includes three concentric grooves 92, 94, 96. A pair of O-rings, 98,100 are mounted in grooves 92 and 96. The purpose of the O-rings is to provide a seal between plates 62 and 60 when the plates are mounted together in any suitable manner such as by threaded fasteners. The central groove 94 communicates with vertical passage 102 which in turn communicates with horizontal passageway 104 connected to a vacuum source in the event there is any leakage so that the gas will be withdrawn before entering reaction zone 22. Similarly a set of three annular grooves 106, 108 and 110 are formed in the top surface of curtain plate 62. O-rings are placed in grooves 106 and 110 to provide a seal between curtain plate 62 and window mounting plate 66. Central groove 108 communicates with passage 112 leading to passageway 104 and plate 62. As shown in FIG. 8, a second vacuum line 114 extends through curtain plate 62 and communicates with V groove 116 at the upper face plate 62. As later described, curtain 20 passes over the upper face of plate 62. As shown in FIG. 8, groove 116 is an endless groove forming a rectangle of a width less than the width of curtain 20. Accordingly, by applying a vacuum to groove 116, there is assurance that the curtain 20 will be held against the upper face of plate 62.

Figure 10:
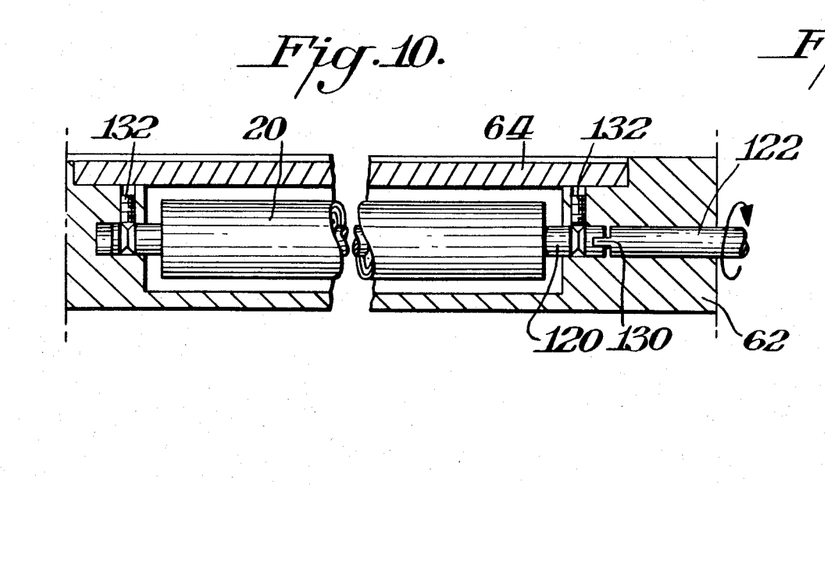
FIG. 10 is a cross-sectional view taken through FIG. 3 along the line 10—10.
Figure 11:
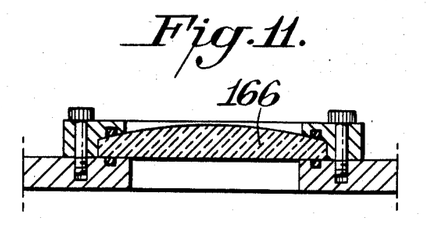
FIGS. 11-12 are cross-sectional views in elevation of alternative lens mounts in accordance with this invention.
Figure 12:
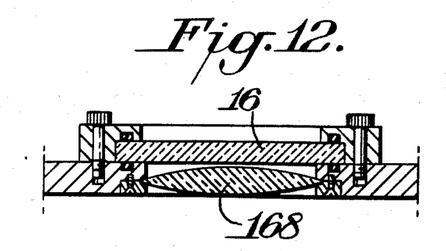

As shown in the various Figures, a pair of rollers 118, 120 is mounted in respective pockets 78 with each roller having an end of curtain 20 secured thereto with the intermediate portion of curtain 20 supported by pins 21. In this manner it is possible to change the portion of curtain 20 which lies directly above the substrates 26 as later described. As shown in FIGS. 2, 3 and 10, the movement of curtain 20 may be accomplished manually by securing the roller shafts to shafts or rods 122, 124 extending externally of curtain plate 62. The shafts may be rotated by manual manipulation of handles 126 secured to shafts 122, 124 or by means of a motor secured in the area of at least one of the handles. The handles may be magnetically coupled by couplers 128 to the shafts 122, 124 and the shafts in turn may be secured to the roller shafts by the tongue in groove coupling 130, as illustrated in FIG. 10. As also illustrated in Figure 10, set screws 132 in pockets 78 function to hold the shafts in place.

Figure 9:
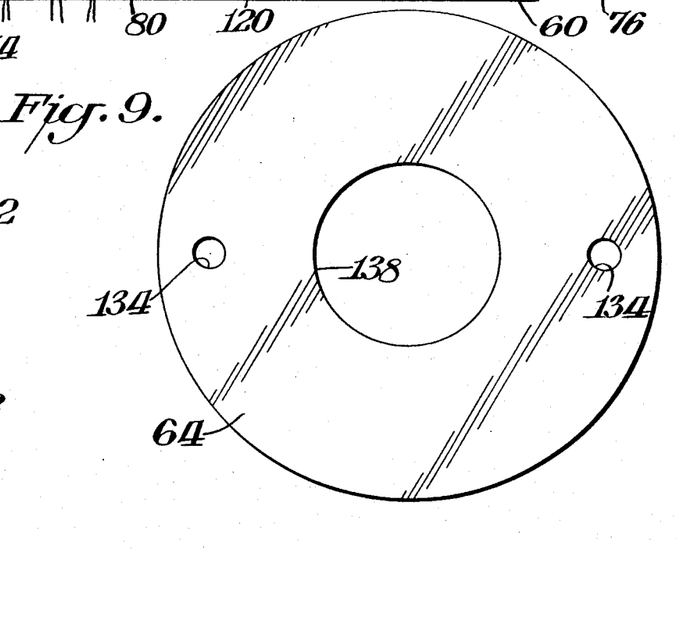
FIG. 9 is a top plan view of the floating clamp plate used in the apparatus of FIGS. 2-6.

FIGS. 2, 6 and 9 illustrate the details of floating clamp plate 64 which is placed in an annular recess in curtain plate 62. As shown in FIG. 9, clamp plate 64 includes a pair of annular openings 134 in communication with pockets 78. Openings 134 are threaded in order to provide for securement to an threaded lifting implement. A central opening 138 is located above substrate platform 70.

As illustrated in FIGS. 2, 6 and 7, a mask 140 is mounted on top of platform 70 to hold the substrates in place. In the illustrated embodiment, four wafers or substrates are provided, and mask 140 has appropriately dimensioned openings to correspond to these substrates. The invention may be practiced, of course, with other substrate arrangements to include other masks. Advantageously, mask 140 is detachably secured to platform 70 by fasteners 142 (FIG. 6) to provide ready detachment and reassembly of various masks.

As illustrated in FIG. 6, when floating clamp 64 is mounted in place, a slight space is created between the upper surface of inner annular boss 144 and the lower surface of clamp plate 64 to accommodate curtain 20 passing therebetween.

As shown in FIG. 6, reaction zone 22 may thus be considered being formed by a base which comprises the upper surface of platform 70 and the recessed surface 146 of curtain plate 62. The peripheral shoulder around recessed surface 146 of portion 144 of plate 62 may be considered a circumferential wall provided outwardly from the base with the curtain 20 spanning the wall to thereby seal the reaction zone 22 from the flush zone 24.

FIGS. 2 and 6 show the details of window mounting plate 66. As indicated therein, plate 66 is generally of disc shape having an annular opening over which quartz window 16 is mounted. An annular groove 148 is further in the top surface of plate 66 for accommodating an O-ring which makes sealing contact with window 16. A pair of handles 150 are provided to facilitate manipulation of plate 66. (See also FIG. 3.)

FIG. 6 also illustrates the details of window mounting ring 68 which includes a recessed inner surface 152 for accommodating window 16. An annular groove 154 is provided for an O-ring which sealingly engages the top surface of window 16. Window ring 68 is mounted to window plate 66 in any suitable manner such as by the threaded fasteners 156 illustrated in FIG. 6.

The various elements incorporated in apparatus 10 interrelate to assure the effective operation of apparatus 10. For example, both a mechanical and a pressure seal is achieved between reaction zone 22 and flush zone 24. In this respect, the vacuum applied to peripheral groove 116 provides a pressure seal acting downwardly upon curtain 20. Floating plate 64 in addition acts as a plate providing a mechanical seal for the two zones.

A further advantage with the apparatus of this invention is that the movable curtain facilitates a clean portion of the curtain being disposed above the reaction zone 22. In addition, a seal is enhanced by having a higher pressure in the flush zone 24 than in the reaction zone 22.

FIG. 6 illustrates an operative embodiment of the reactor 10 using the two separated zones—the window flush zone 24 and the reaction zone 22. The material of construction of both zones may be 304 stainless steel. The flexible transparent window is preferably Teflon although any inert, transparent, flexible polymer is suitable such as polyvinylidene fluoride. The window 16 may be high quality quartz form Esco Products Inc. The rollers 118, 120 for the curtain may also be 304SS. The rotary feedthrough is particularly designed for high vacuum. The reactor components were sealed against air by captured "viton" O-rings.

In an operative example of the invention the following conditions are established in reaction zone 22 and in flush zone 24 for depositing on undoped a-Si:H. The same conditions in flush zone 24 would be used for depositing on other materials since these conditions would be independent of the film to be deposited. Light 28 is a low pressure Hg vapor lamp, 12–15 mW/cm$^2$ BHK Inc. Model No. 88-9102-02. Window 16 is a UV transparent window 4 inches in diameter, $\frac{3}{8}$ inch thick from Esco Products. by adjustment of valves 38 of reservoirs 36 and of valve 44 a flow rate of 50–100 sccm of 4% H$_2$ in Ar is established at 5–20 torr total pressure. Valve 38 is a Tylan Mass Flow Controller FC-260. A mercury bubbler is not used. Curtain 20 is a Teflon curtain, PFA grade under designation 100LP from the DuPont Company, 1 mil thick, PFA grade. A new curtain region is exposed every 0.5–8 minutes.

As noted, the above conditions in flush zone 24 would be used regardless of the film to be deposited. For undoped a-Si:H, reservoirs 30 would supply high purity He or H$_2$ and high purity disilane or silane. Valves 323 are Tylan mass flow controllers FC-260 which provide a flow rate of 5–20 sccm for the He or H$_2$ and 1–3 sccm for the disilane or silane flow. Mercury bubbler or pot would have its temperature controlled to 20° C.–60° C. Pressure control valve 54 is functionally the same as valve 44 and creates a pressure of 5–10 torr. Heaters 48 heat the substrates to 200° C.–280° C. Substrate 26 may be glass, stainless steel, silicon, glass coated with SnOx or metal.

When the above conditions in zones 22 and 24 are established, light 28 is turned on. In a deposition time of 30–120 minutes, a growth rate of 0.1–2 Å/sec. is achieved with a film thickness of 180–14,000 Å. The resulting film properties are: an optical gap of 1.7–1.9 eV, a photoconductivity of $10^{-6}$ to $10^{-4} (\Omega\text{-cm})^{-1}$; and a dark conductivity of $10^{-11}$ to $10^{-9} (\Omega\text{-cm})^{-1}$.

Figure 4:
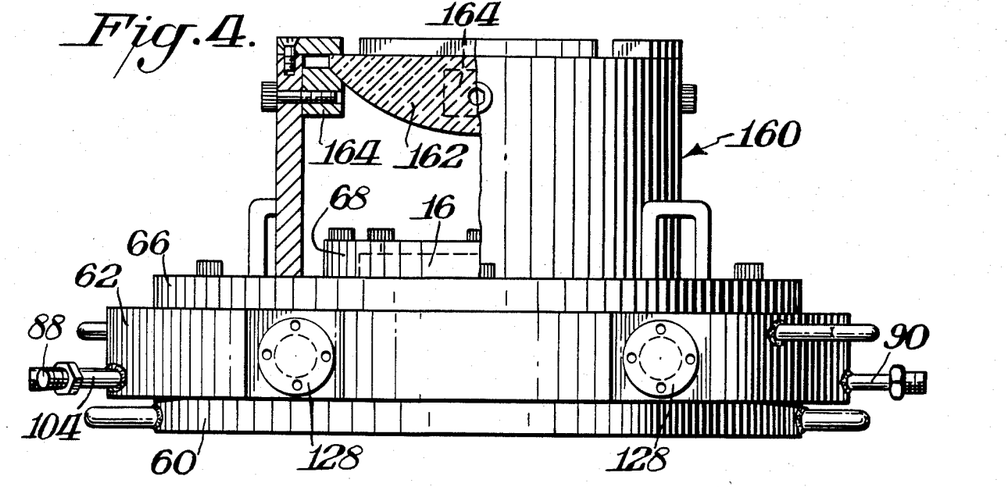
FIG. 4 is a front elevational view partly in section of the apparatus shown in FIG. 3 with a lens mount.
Figure 5:
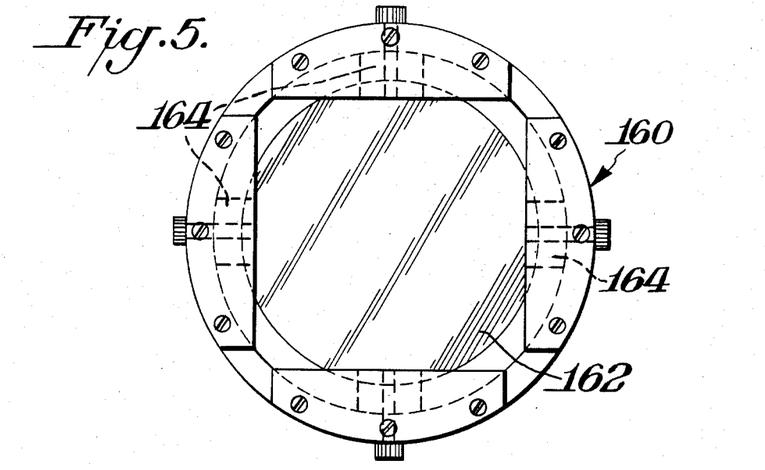
FIG. 5 is a top plan view of the apparatus shown in FIG. 4.

This invention may be practiced with a number of variations without departing from the spirit of the invention. FIG. 4, for example, illustrates a lens mount 160 mounted on top of window plate 66. As illustrated, lens 162 rests on brackets 164 to provide light magnification outside window 16. The growth rate can also be improved by spacing the curtain 20 much closer to the lens than to the substrates. The lens may take various forms such as lens 166 illustrated in FIG. 9. In addition, the lens may be mounted below window 16 such as lens 168 illustrated in FIG. 10.

Since portions of the curtain 20 are repeatedly deposited on, those portions may be moved into a separate etching chamber (not illustrated) and then moved back into the deposition zone. The etching technique may be plasma, wet etch with basic solution or a photodecomposition etch.

The alloy deposition may include various materials including Si-C, Si-Ge, Si-Sn, $SiO_2$, $SnO_2$, $Si_2N_3$, $ITO_2$, iron, InP, GaAs, CdHgTe, CdTe, ZnS, oxynitride, tin and doped semiconductors.

Variations of gases to deposit other films include 1-3 sccm $GeH_4$ to yield a-SiGe:H, 0.01-0.06 sccm $B_2H_6$ to yield p-type a-Si:H, 0.01-0.06 sccm $PH_3$ to yield n-type a-Si:H, and 0.05-0.3 sccm $C_2H_2$ to yield a-SiC:H.

Multiple chambers may be connected via load locks so that sequential deposition may be accomplished in separate chambers or sequential depositions can be accomplished in a single large reactor chamber by stopping the reaction—turning off the light—and altering gas feeds to those necessary for the next layer.

Lamp 28 may be internally mounted inside the reactor 10 above the curtain 20 or a mercury vapor plasma may be generated in the window flush zone 24. In either case, since the light source is not outside the reactor, a window does not need to be provided other than to visually inspect the contents of the reactor. This provides a greater light intensity since light losses through the window are eliminated.

What is claimed is:

1. A photochemical vapor deposition apparatus for depositing selected materials on at least one substrate comprising a reactor housing, a window in one wall of said housing, a reaction chamber in said housing in the portion of said housing having said window whereby an ultraviolet light may be disposed outside said housing to pass UV radiation into said reaction chamber through said window, a transparent curtain dividing said reaction chamber into a reaction zone and a flush zone, substrate mounting means in said reaction zone in light communication with said window through said curtain, said reaction zone being formed by a base and a peripheral wall projecting outwardly from said base around said substrate mounting means, said curtain spanning said peripheral wall parallel to said base to seal said reaction zone from said flush zone, means for feeding a reactant gas to said reaction zone, means for withdrawing the reactant gas from said reaction zone, and means for flowing inert diluent gas into said flush zone and in the space between said window and said curtain.

2. The apparatus of claim 1 including means for applying both a pressure and a mechanical seal to said curtain.

3. The apparatus of claim 1 wherein said curtain is a flexible film wound onto a pair of rollers, one of said rollers being mounted on one side of said reaction zone, the other of said rollers being mounted on the opposite side of said reaction zone, and means for rotating said rollers to change the portion of said curtain disposed over said reaction zone.

4. The apparatus of claim 3 including a substrate base plate mounted in said housing, a platform on said base plate, said substrate being mounted on said platform, a curtain plate secured to said base plate, a generally central opening extending completely through said curtain plate with a peripheral wall defining said generally central opening, said platform extending through said opening to comprise at least a part of said base of said reaction zone, and said peripheral wall comprising said peripheral wall of said reaction zone.

5. The apparatus of claim 4 including reaction gas passageways in said curtain plate to comprise said means for feeding said reactant gas to said reaction zone and said means for withdrawing said reactant gas from said reaction zone, and diluent gas passageways in said curtain plate to comprise said means for flowing said diluent gas into said flush zone.

6. The apparatus of claim 5 including sealing means between said base plate and said curtain plate, and vacuum applicating means applying a suction between said base plate and said curtain plate.

7. The apparatus of claim 6 including a pocket formed in said curtain plate on each side of said generally central opening, and each of said rollers being mounted in a respective one of said pockets.

8. The apparatus of claim 7 wherein the top wall of said curtain plate has a generally central recess with said peripheral wall having its upper surface as part of said recess, a clamp plate mounted in said recess, the bottom wall of said clamp plate being slightly spaced from said upper surface of peripheral wall, and said curtain extending over said upper surface of said peripheral wall.

9. The apparatus of claim 8 including a peripheral groove in said upper surface of said peripheral wall completely around said generally central opening, said curtain completely covering said peripheral groove, and means for applying a vacuum to said peripheral groove.

10. The apparatus of claim 9 including a window mounting plate mounted to said curtain plate, said window mounting plate comprising at least part of said one wall of said housing, an opening extending completely through said window mounting plate in line with said platform, said window being mounted across said window mounting plate, the lower surface of said window mounting plae being spaced from the top surface of said clamp plate to create a slot therebetween, said clamp plate partially closing said pockets with said pockets also communicating with said slot, and said diluent gas passageways communicating with said pockets whereby diluent gas may be fed into one of said pockets and into said slot and across said curtain and then exit through said slot and through the other of said pockets.

11. The apparatus of claim 10 including sealing means between said curtain plate and said window mounting plate, and said vacuum applying means also applying a suction between said curtain plate and said window mounting plate.

12. The apparatus of claim 11 including lifting means on each of said base plate and said clamp plate and said window mounting plate.

13. The apparatus of claim 12 wherein said lifting means comprises handles on said base plate and said window mounting plate and threaded openings in said clamp plate.

14. The apparatus of claim 7 wherein each of said rollers is mounted on a first shaft, a second shaft coaxially connected to each of said first shafts and extending through said curtain plate, and a handle secured to each of said second shafts externally of said housing to permit the manipulation of said rollers and comprise said means for rotating said rollers.

15. The apparatus of claim 14 including motor means connected to at least one of said handles for controlling the rotation of its roller.

16. The apparatus of claim 5 wherein said reaction gas passageways comprises a first generally horizontal passageway leading from the exterior of said curtain plate to said peripheral wall a first series of generally vertical passageways leading from said first generally horizontal passageway to said reaction zone, a second generally horizontal passageway leading from the exterior of said curtain plate to said peripheral wall, and a second series of generally vertical passageways leading from said second generally horizontal passageway to said reaction zone.

17. The apparatus of claim 16 including reactant gas feed means connected to said first generally horizontal passageway.

18. The apparatus of claim 4 including heating elements and thermocouples in said platform, said platform having a recessed upper wall for receiving said substrate, and a mask mounted over said recessed upper wall.

19. The apparatus of claim 1 including an ultraviolet light mounted in line with said substrate, and a lens mounted between said ultraviolet light and said substrate.

20. A method of depositing selected materials on a substrate by photochemical vapor deposition, comprising mounting a substrate in the reaction chamber of a housing, dividing the reaction chamber into a reaction zone and a flush zone sealed from each other by a flexible transparent curtain, heating the substrate while flowing a reactant gas into and out of the reaction zone, directing UV radiation toward the substrate by an ultraviolet light which radiates through a window in the housing and through the curtain to create the photochemical vapor deposition, and flowing an inert diluent gas into the flush zone during the photochemical vapor deposition.

21. The method of claim 20 including providing both a mechanical and a pressure seal to the curtain.

22. The method of claim 21 including mounting the curtain to rollers on each side of the reaction zone, and manipulating the rollers to control the portion of the curtain sealably covering the reaction zone.

* * * * *

UNITED STATES PATENT AND TRADEMARK OFFICE
CERTIFICATE OF CORRECTION

PATENT NO. : 4,654,226

DATED : March 31, 1987

INVENTOR(S) : Scott C. Johnson, et al.

It is certified that error appears in the above-identified patent and that said Letters Patent is hereby corrected as shown below:

In Figure 6, the lead line for numeral 104 should extend to the horizontal passage way.

Col. 6, line 48 "323" should be --32--;

Col. 6, line 53 "5-10" should be --5-20--;

Col. 7, line 14 "ITO2" should be --ITO--; and

Col. 7, line 15 "silicon" should be before "oxynitride".

Signed and Sealed this

Fifteenth Day of December, 1987

Attest:

DONALD J. QUIGG

Attesting Officer      Commissioner of Patents and Trademarks